(12) United States Patent
Penner et al.

(10) Patent No.: US 8,142,984 B2
(45) Date of Patent: Mar. 27, 2012

(54) LITHOGRAPHICALLY PATTERNED NANOWIRE ELECTRODEPOSITION

(75) Inventors: Reginald M. Penner, Newport Beach, CA (US); Erik J. Menke, Merced, CA (US); Michael A. Thompson, Menlo Park, CA (US); Chengxiang Xiang, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 464 days.

(21) Appl. No.: 12/376,209

(22) PCT Filed: Aug. 21, 2007

(86) PCT No.: PCT/US2007/076433
§ 371 (c)(1),
(2), (4) Date: Feb. 3, 2009

(87) PCT Pub. No.: WO2008/024783
PCT Pub. Date: Feb. 28, 2008

(65) Prior Publication Data
US 2009/0197209 A1    Aug. 6, 2009

(51) Int. Cl.
*G03F 7/00* (2006.01)
*G03F 7/26* (2006.01)
*G03F 7/40* (2006.01)
*G03F 7/42* (2006.01)

(52) U.S. Cl. ......... 430/311; 430/318; 430/322; 430/331

(58) Field of Classification Search ............... 430/270.1, 430/311, 318, 322, 331
See application file for complete search history.

(56) References Cited

U.S. PATENT DOCUMENTS

| 6,110,354 | A | 8/2000 | Saban et al. |
| 6,662,442 | B1* | 12/2003 | Matsui et al. ............... 29/852 |
| 2002/0158342 | A1 | 10/2002 | Tuominen et al. |
| 2004/0023253 | A1 | 2/2004 | Kunwar et al. |
| 2004/0146560 | A1 | 7/2004 | Whiteford et al. |
| 2004/0238367 | A1 | 12/2004 | Penner et al. |
| 2005/0176228 | A1 | 8/2005 | Fonash et al. |
| 2006/0097389 | A1 | 5/2006 | Islam et al. |
| 2009/0020315 | A1* | 1/2009 | Dutton ......................... 174/250 |

OTHER PUBLICATIONS

Menke et al., "Lithographically patterned nanowire electrodeposition", Nature Matreials, vol. 5, pp. 914-919 (Nov. 2006).

(Continued)

*Primary Examiner* — Amanda C. Walke
(74) *Attorney, Agent, or Firm* — Orrick, Herrington & Sutcliffe LLP

(57) ABSTRACT

Lithographically patterned nanowire electrodeposition (LPNE) combines attributes of photolithography with the versatility of bottom-up electrochemical synthesis. Photolithography is employed to define the position of a sacrificial nanoband electrode, preferably formed from a metal such as nickel, copper, silver, gold or the like, which is stripped using electrooxidation or a chemical etchant to advantageously recess the nanoband electrode between a substrate surface and the photoresist to form a trench defined by the substrate surface, the photoresist and the nanoband electrode. The trench acts as a "nanoform" to form an incipient nanowire during its electrodeposition. The width of the nanowire is determined by the electrodeposition duration while its height is determined by the height of the nanoband electrode.

20 Claims, 10 Drawing Sheets

OTHER PUBLICATIONS

Spicer, D. F., Rodger, a. C. & Vernell, G. L. Computer-Controlled Pattern Generating System for Use with Electron-Beam Writing Instruments. Journal of Vacuum Science & Technology 10, 1052-1055 (1973).

Varnell, G. L., Spicer, D. F. & Rodger, a. C. E-Beam Writing Techniques for Semiconductor-Device Fabrication. Journal of Vacuum Science & Technology 10, 1048-1051 (1973).

Vieu, C. et al. Electron beam lithography: resolution limits and applications. Applied Surface Science 164, 111-117 (2000).

Berger, S. D. & Gibson, J. M. New Approach to Projection-Electron Lithography with Demonstrated 0.1 μM Linewidth. Applied Physics Letters 57, 153-155 (1990).

Berger, S. D. et al. Projection Electron-Beam Lithography—a New Approach. Journal of Vacuum Science & Technology B 9, 2996-2999 (1991).

Liddle, J. A. et al. Space-charge effects in projection electron-beam lithography: Results from the SCALPEL proof-of-lithography system. Journal of Vacuum Science & Technology B 19, 476-481 (2001).

Jorritsma, J., Gijs, M. A. M., Kerkhof, J. M. & Stienen, J. G. H. General technique for fabricating large arrays of nanowires. Nanotechnology 7, 263-265 (1996).

Natelson, D., Willett, R. L., West, K. W. & Pfeiffer, L. N. Fabrication of extremely narrow metal wires. Applied Physics Letters 77, 1991-1993 (2000).

Natelson D., Willett R. L., West K. W. & Pfeiffer L. N. Geometry-dependent dephasing in small metallic wires. Physical Review Letters 86, 1821-1824 (2001).

Melosh, N. A. et al. Ultrahigh-density nanowire lattices and circuits. Science 300, 112-115 (2003).

Thompson, M. A., Menke, E. J., Martens, C. C. & Penner, R. M. Shrinking nanowires by kinetically controlled electrooxidation. J Phys Chem B 110, 36-41 (2006).

Nagale, M. P. & Fritsch, I. Individually addressable, submicrometer band electrode arrays. 1. Fabrication from multilayered materials. Analytical Chemistry 70, 2902-2907 (1998).

Bard, A. J. Electrochemical Methods: Fundamentals and Applications (Wiley & Sons, New York, 2001), Table of Contents.

Durkan, C. & Welland, M. E. Size effects in the electrical resistivity of polycrystalline nanowires. Phys Rev B 61, 14215-14218(2000).

Marzi, G. D., Iacopino, D., Quinn, A. J. & Redmond, G. Probing intrinsic transport properties of single metal nanowires: Direct-write contact formation using a focused ion beam. J Appl Phys 96, 3458-3462 (2004).

Yang, F. Y. et al. Large magnetoresistance of electrodeposited single-crystal bismuth thin films. Science 284, 1335-1337 (1999).

Yang, F. Y. et al. Large magnetoresistance and finite-size effect in electrodeposited bismuth lines. J Appl Phys 89, 7206-7208 (2001).

Chiu, P. & Shih, I. A study of the size effect on the temperature-dependent resistivity of bismuth nanowires with rectangular cross-sections. Nanotechnology 15, 1489-1492 (2004).

Fuchs, K. The conductivity of thin metallic films according to the electron theory of metals. P Camb Philos Soc 34, 100-108 (1938).

Sondheimer, E. H. The Mean Free Path of Electrons in Metals. Adv Phys 1, 1-42 (1952).

* cited by examiner

LITHOGRAPHICALLY PATTERNED NANOWIRE ELECTRODEPOSITION

FIELD OF THE INVENTION

The present invention relates to a method for preparing metal nanowires on insulating surfaces and, more particularly, to the electrodeposition of lithographically patterned nanowires.

BACKGROUND

Electron beam lithography (EBL), developed in the early 70's, provides a means for patterning polycrystalline metal nanowires as small as 20 nm in diameter onto surfaces. The applicability of EBL, however, has been limited to research and development applications because it is a serial patterning technology. In 1990, a parallel version of EBL was described, but space charge "blurring" prevented this technique from approaching the resolution of direct-write EBL. By using, as a template, semiconductor surfaces with atomically-defined grooves and troughs, sub-10 nm metal nanowires have been prepared using vapor deposition. A variant of this approach has been used to create high density arrays of linear, 10 nm diameter, platinum nanowires. We previously demonstrated that ensembles of 30 nm antimony nanowires can be prepared by electrochemical step edge decoration on graphite surfaces coupled with etching, but no control of nanowire position on the surface or inter-wire pitch has been possible using this method.

It is desirable to provide a method for preparing nanowires with the ability to control the position on the surface the nanowire is formed, as well as the inter-wire pitch.

SUMMARY

Embodiments described herein are directed to a new method for preparing metal nano-wires that are as small as about 20 nm in width, and patterning these wires over large areas of the surface of an insulator to create patterned metal nanowires. In a preferred embodiment, the method preferably involves optical lithography coupled with the electrodeposition of metal. Nanowire fabrication methods can be classified either as "top down", involving photo- or electron beam lithography or "bottom-up", involving the synthesis of nanowires from molecular precursors. Lithographically patterned nanowire electrodeposition (LPNE) combines attributes of photolithography with the versatility of bottom-up electrochemical synthesis. Photolithography is employed to define the position of a sacrificial nanoband electrode, preferably formed of nickel, copper, silver, gold and other metals, which is stripped using electrooxidation or a chemical etchant to advantageously recess the nanoband electrode between the substrate surface and the photoresist to form a trench defined by the substrate surface, the photoresist and the nanoband electrode. The trench acts as a "nanoform" to form an incipient nanowire during its electrodeposition. The width of the nanowire is determined by the electrodeposition duration while the height of the nanowire is determined by the thickness of the nanoband electrode.

Removal of the remaining photoresist and electrode layer material reveals a nanowire—preferably composed of a metal such as gold, platinum, palladium, cadmium, bismuth, or the like or a mettalloid, such as, e.g., silicon, germanium and the like, with a rectangular cross section and a height and width that can be independently controlled as a function of trench height and electrodeposition duration, down to about 20 nm in width and 6 nm in height. The polycrystalline nanowires synthesized by LPNE can be continuous for more than about 2 cm. These nanowires show a metal-like temperature dependent resistance.

BRIEF DESCRIPTION OF FIGURES

FIGS. 2($b$) and ($c$) are graphs showing cyclic voltammogram for $Ru(NH_3)_6^{3+}$ at 5 mV s$^{-1}$ in aqueous 0.1M NaCl before the removal of nickel and after the removal of nickel by electrooxidation resulting in the formation of a horizontal trench about 200 nm in depth terminated by a nickel nanoband about 40 nm in height.

FIG. 3($b$) is a SEM image showing a gold nanowire with a rectangular cross-section obtained from trench-confined growth for 100 s.

FIG. 3($c$) is a SEM image of a gold nanowire deposited for 1000 s showing "blooming" from the edge of the photoresist.

FIG. 5($b$) is a graph showing nanowire height, measured by AFM, versus the thickness of the nickel layer deposited in step 1 of the LPNE process depicted in FIG. 1.

FIG. 5($c$) is a graph showing nanowire width, measured by SEM, as a function of the electrodeposition time. For both FIGS. 5($b$) and ($c$), error bars represent +1σ for at least ten measurements of each nanowire.

FIG. 6($b$) is a graph showing temperature dependence of the wire resistivity, p, normalized to the resistivity at 300K, $\rho_{300}$, from 10 K to 350 K, for the same two nanowires shown in (a), and the resistivity of bulk gold.

DESCRIPTION

Figure 1:
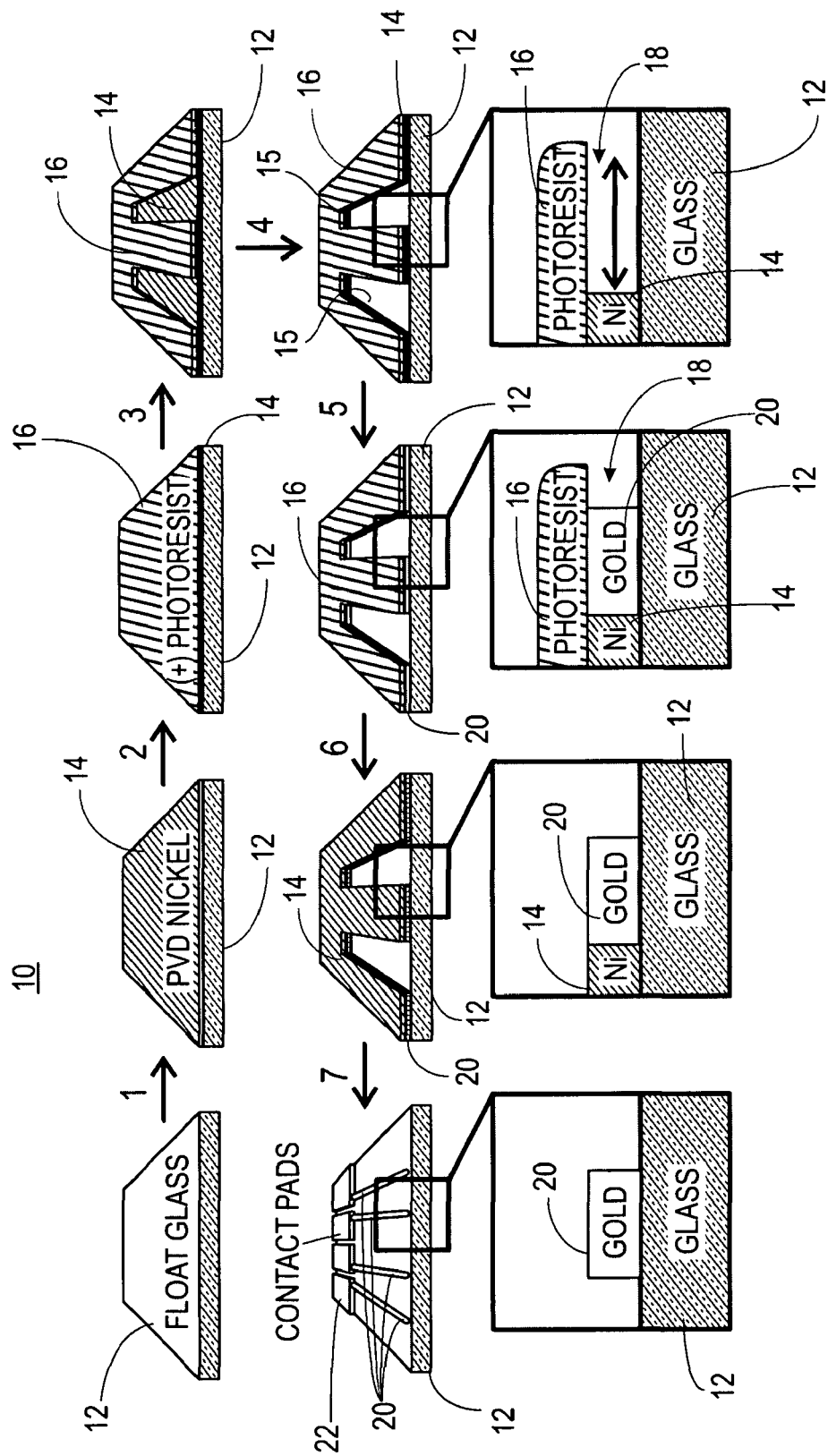
FIG. 1 is a schematic showing a seven step process flow for metal nanowire fabrication using lithographically patterned nanowire electrodeposition (LPNE).

Embodiments described herein are directed to a method of lithographically patterned nanowire electrodeposition (LPNE) for preparing metal nanowires and patterning these nanowires over large areas of the surface of an insulator such as glass, oxidized silicon or the like. As depicted in FIG. 1, the LPNE process 10 involves the preparation of a sacrificial nanoband electrode 14, formed of nickel, copper, silver, gold or other metals, using optical lithography, and the subsequent electrodeposition at the sacrificial nanoband electrode 14 of a metal nanowire 20, preferably formed of a noble metal such as gold, platinum or palladium (Au, Pt, or Pd) but may include other metals, such as, cadmium, bismuth and the like or metalloids, such as, e.g., silicon, germanium and the like. The nanoband electrode 14 is preferably recessed between the surface of the insulator 12 and a photoresist layer 16 forming a trench 18 defined by the surface of the insulator 12, the electrode 14 and the photoresist 16. The electrodeposition of a nanowire 20 into this "nanoform" produces a wire 20 with a generally rectangular cross-section where the height and width are independently controllable as a function of trench height and electrodeposition duration within a precision of about 5 nm, down to about 20 nm in width and 6 nm in height. Since optical lithography is used to define the position of the nanowires 20 on the surface of the insulator 20, the spacing between nanowires 20 is constrained by the optical diffraction limit.

The LPNE process 10 shown in FIG. 1 is described in greater detail as follows with regard to an example of an implementation of the process. One of skill in the art will readily recognize that the materials used were chose for exemplary purposes only. The LPNE process 10 was implemented as follows: Soda lime glass microscope slides were cleaned in aqueous Nochromix solution, air dried, and diced into 1"×1" glass squares 12. Onto each glass square 12, a nickel film 14 (ESPI, 5N purity), 20-100 nm in thickness, was deposited by hot filament evaporation at a rate of 0.5-1.5 Å s$^{-1}$ (Step 1). The film thickness and evaporation rate were monitored using a quartz crystal microbalance (Sigma Instruments).

The nickel film-covered glass squares were then coated with a positive photoresist layer 16 (Shipley 1808) by spin coating (Step 2). This involved the deposition of about a 1 mL aliquot of photoresist onto each square and the rotation of the square at about 2500 rpm for 40 s. This produced a photoresist layer 16 having a thickness (after soft baking) of about 1 um. The freshly coated squares were soft-baked at about 90° C. for 30 minutes. After cooling to room temperature, a transparent contact mask (not shown) was pressed onto the photoresist 16 with a quartz plate (not shown) and the masked surface was exposed to UV light having a wavelength of about 365 nm and output power of about 0.5 mW cm$^2$ for 2 minutes. To remove unexposed portions of the photoresist 16 and expose the nickel layer 14, the slide was then soaked first in a developer/water solution (1 part Shipley MF-351 to 4 parts water) for 20 s, and then in pure water for 1 minute, before drying in a stream of ultra-high purity (UHP) N$_2$ (Step 3). The exposed nickel 14 was then electrochemically removed (Step 4) and palladium, platinum, or gold 20 was electrodeposited (Step 5) onto the nickel nanoband electrodes 14 produced by this process.

The electrochemical stripping of the nickel layer 14 and the electrodeposition of these metals 20 was carried out in a 50 mL, one compartment, three-electrode cell. Nickel dissolution was carried out in aqueous 0.1 M KCl containing 0.1 mL of concentrated HCl. Palladium was electroplated from an aqueous solution containing 2 mM Pd(NO$_3$)$_2$, 2 mM saccharine, and 0.1 M KCl. Platinum was electroplated from a solution containing 0.1 M KCl, and 1.0 mM K$_2$PtCl$_6$ at 0.025 V vs. SCE. Gold was electroplated from aqueous commercial gold plating solution (Clean Earth Solutions, Carlstadt, N.J.—a 6 mM AuCl$_3$ solution), with added 1.0M KCl at −0.90 V vs. SCE. All aqueous solutions were prepared using Millipore MilliQ water (σ>18.0 MΩcm). A saturated calomel reference electrode (SCE) and a 2 cm$^2$ Pt foil counter electrode were also employed. The stripping and deposition were both carried out on a computer-controlled EG&G 273A potentiostat/galvanostat.

The removal of the sacrificial metal (nickel, silver, copper, gold, or the like) layer can be accomplished using either electrooxidation or chemical etching. As one preferred embodiment, the stripping of the nickel layer 14 is achieved by securing the photoresist 16—covered nickel film 14 with self-closing metal tweezers, and placing part of the exposed nickel film 14 in the nickel stripping solution. The film 14 was then held at a potential of −0.085 V vs. SCE for 1000 s. This removed all of the exposed nickel 14 and produced an "undercut" beneath the photoresist 16 at each edge of the nickel layer 14 produced by photolithography on the surface. The slide was then rinsed with Nanopure water, and placed into the palladium deposition solution. Palladium metal 20 was electrodeposited by holding the nickel film 14 at a potential of about +0.225 V vs. SCE for times ranging from about 25 to 400 s. The glass slide 12 was then rinsed with Nanopure water and dried with UHP N$_2$. The photoresist 16 was then removed (Step 6) by rinsing the slide with electronic grade acetone (Acros), methanol (Fisher), then Nanopure water, respectively, before drying with UHP N$_2$. The excess nickel film 14 was then removed by washing with dilute HNO$_3$ (Step 7).

Figure 2A:
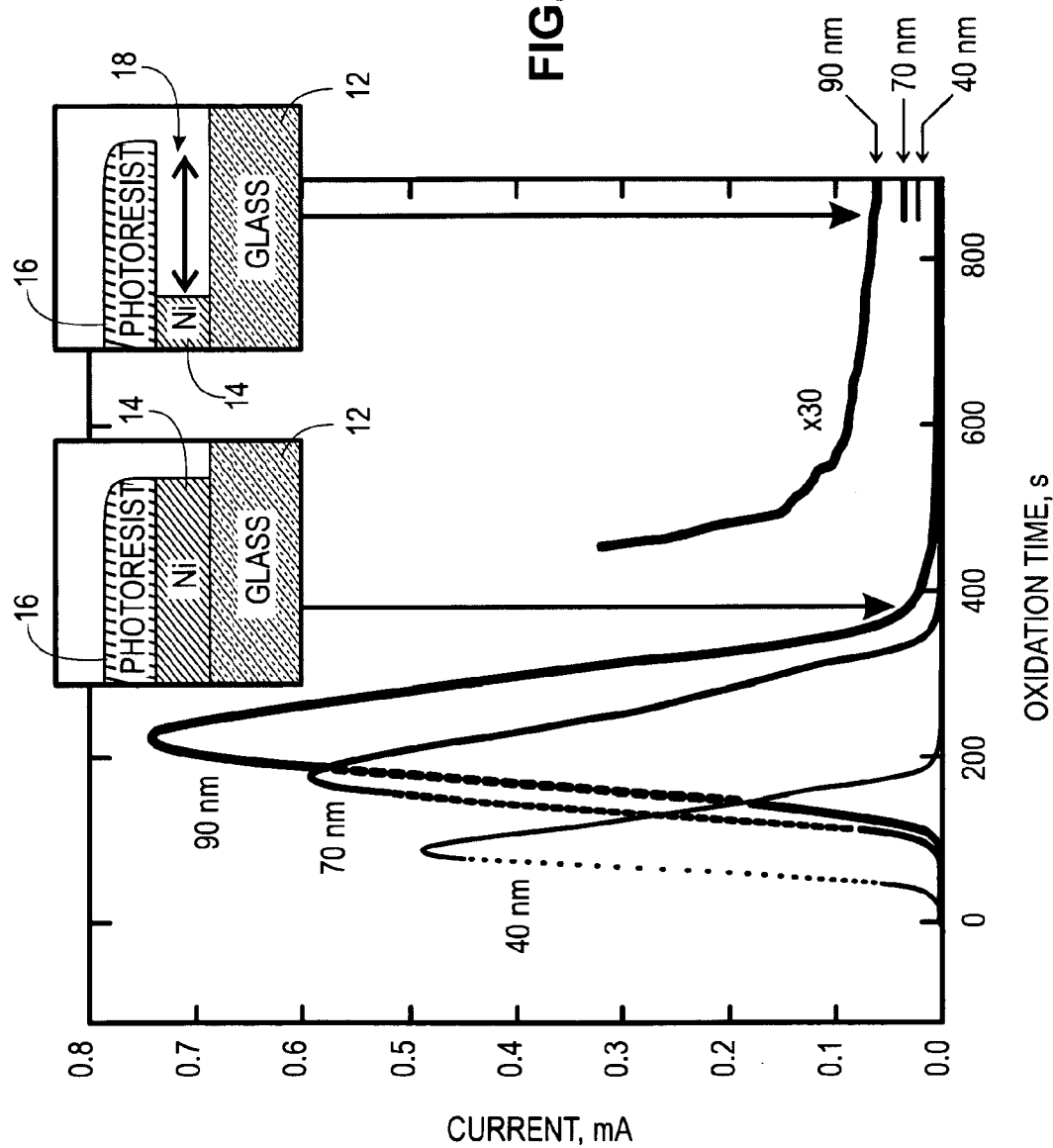
FIG. 2($a$) is a graph showing oxidation current versus time during the removal of nickel from lithographically patterned surfaces by potentiostatic electrooxidation (reaction: $Ni \rightarrow Ni^{2+}+2e-$) at −0.10 V vs. SCE in aqueous 0.1 M KCl at pH=1.0.

The position of the nanowires 20 on a surface of an insulator 12 such as glass is determined by the position of the nanoband electrodes 14 prepared in the first four steps of the LPNE process 10 shown in FIG. 1. In Fritsch et al., Individually addressable, submicrometer band electrode arrays; Fabrication from multilayered materials; Analytical Chemistry 70, 2902-2907 (1998), gold nanoband electrodes were prepared using a process similar to the first four steps shown in FIG. 1, but lacking in the formation and use of a trench 18 as described and illustrated herein. The process 10 depicted in FIG. 1 advantageously removes exposed nickel or other nanoband electrode material 14 electrochemically at step 4 by applying an oxidizing potential to the material, which for nickel is in the range from about −0.085 to −0.10 V vs. SCE (see FIG. 2a). Oxidation is continued until the electrode material 14 at the exposed edges 15 of the pattern is etched, preferably undercutting the photoresist 16 by about 100-300 nm (FIG. 2a). Three transients are shown in FIG. 2a for nickel layers 14 with approximate thicknesses of 40 nm, 70 nm, and 90 nm. For nickel films of these thicknesses, as shown, the etching current is approximately proportional to the nickel film thickness as the electrochemical undercutting occurs. "Over-etching" of the material produces a trench 18, horizontally oriented in this instance, into which a metal nanowire 20 can be electrodeposited in step 5 of FIG. 1.

Figure 2C:
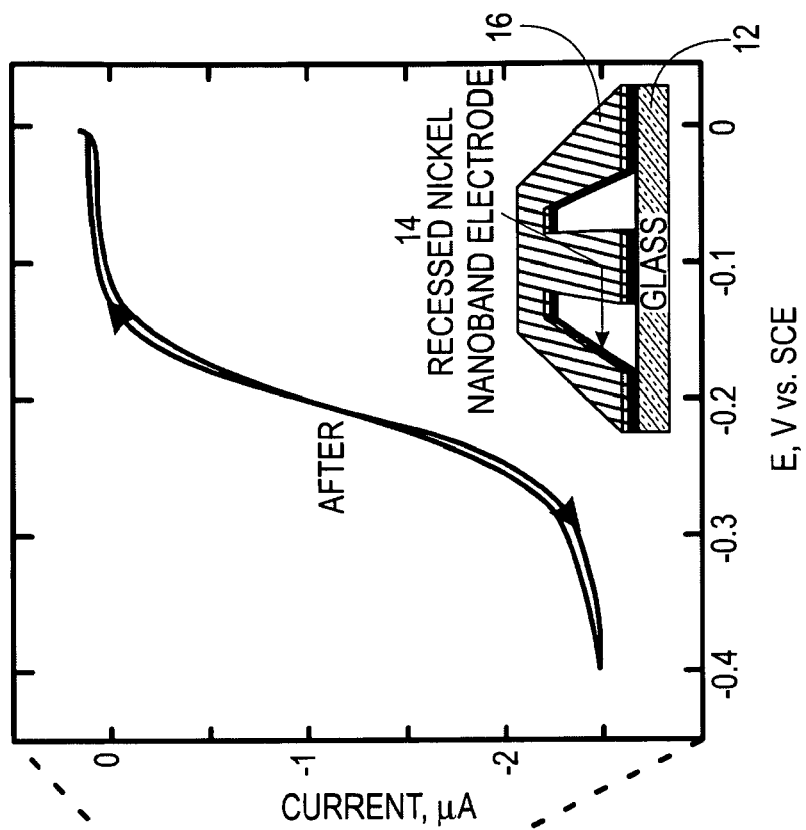
Figure 2B:
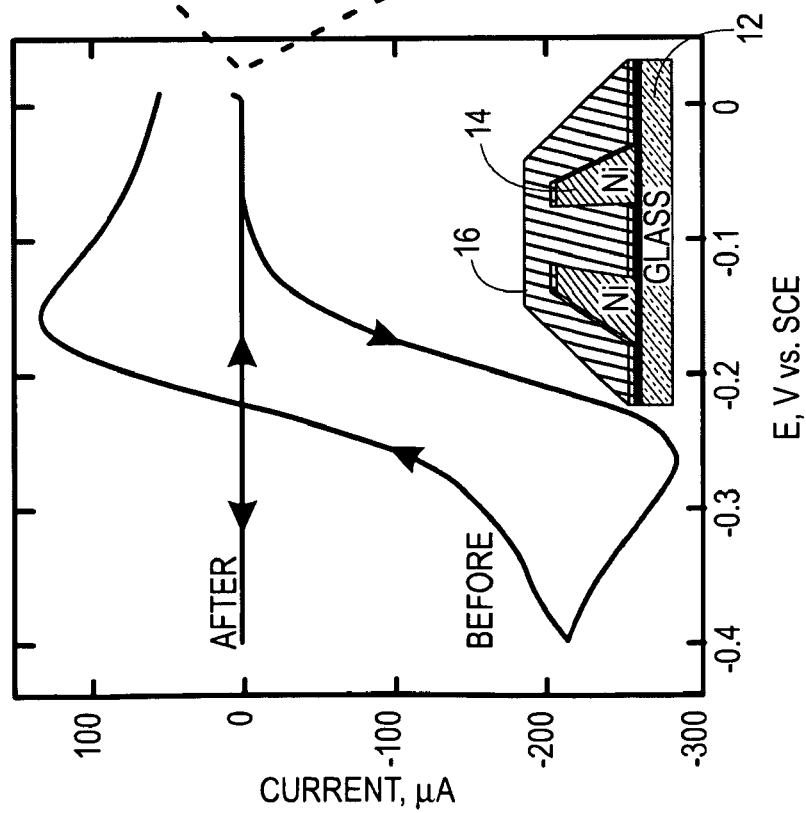

A recessed nickel nanoband 14 is both electrochemically reactive and accessible to redox species. To confirm this, the cyclic voltammetry of Ru(NH$_3$)$_6^{3+}$, a metal complex, which undergoes a fast, reversible one electron reduction, was investigated. Before dissolution of the exposed nickel, as shown in FIG. 2b, the cyclic voltammogram shows current peaks and hysteresis of the forward and reverse scans; all consistent with the planar diffusion of this molecule to the relatively large nickel areas exposed by the dissolution of photoresist after lithography. After electrooxidation of the nickel and the formation of the horizontal trench, as shown in FIG. 2c, the Ru(NH$_3$)$_6^{3+}$ reduction current was reduced by a factor of more than 100 and a steady-state, sigmoidal CV showing no hysteresis was observed, qualitatively as expected for a nanoband electrode. This result demonstrated that the recessed nickel electrode was both electrochemically active and accessible to the dissolved redox species Ru(NH$_3$)$_6^{3+}$, as required for nanowire electrodeposition.

Figure 3A:
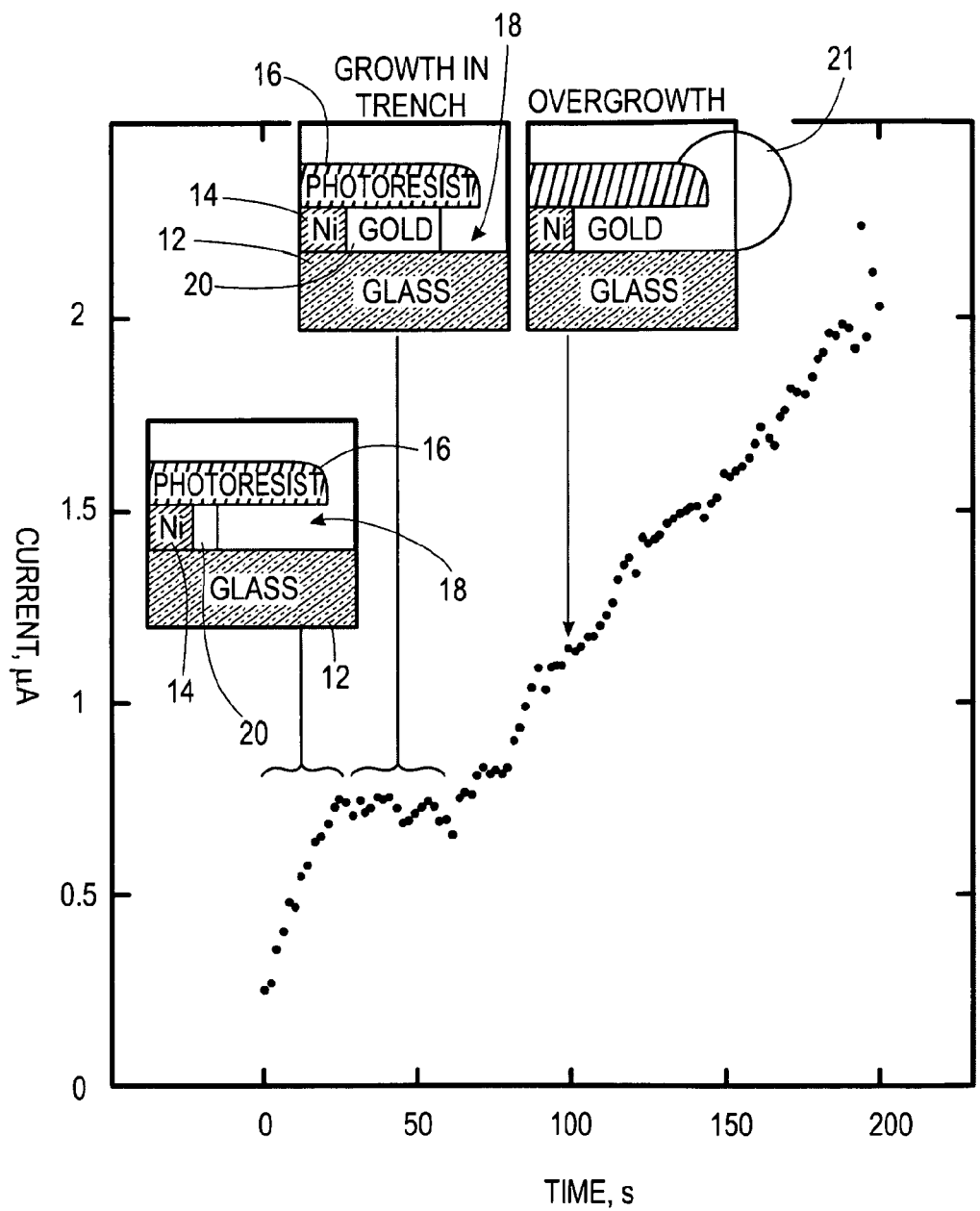
FIG. 3($a$) is a graph showing electrodeposition current versus time for the potentiostatic growth, and overgrowth, of a palladium nanowire at +0.225 V vs. SCE.
Figure 3C:
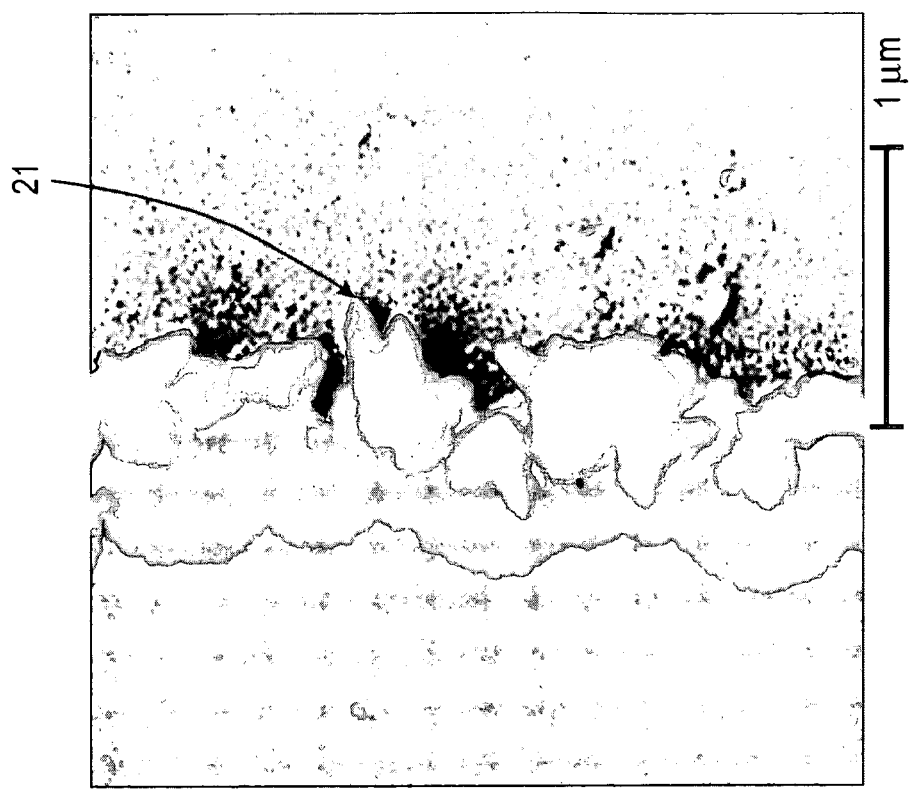
Figure 3B:
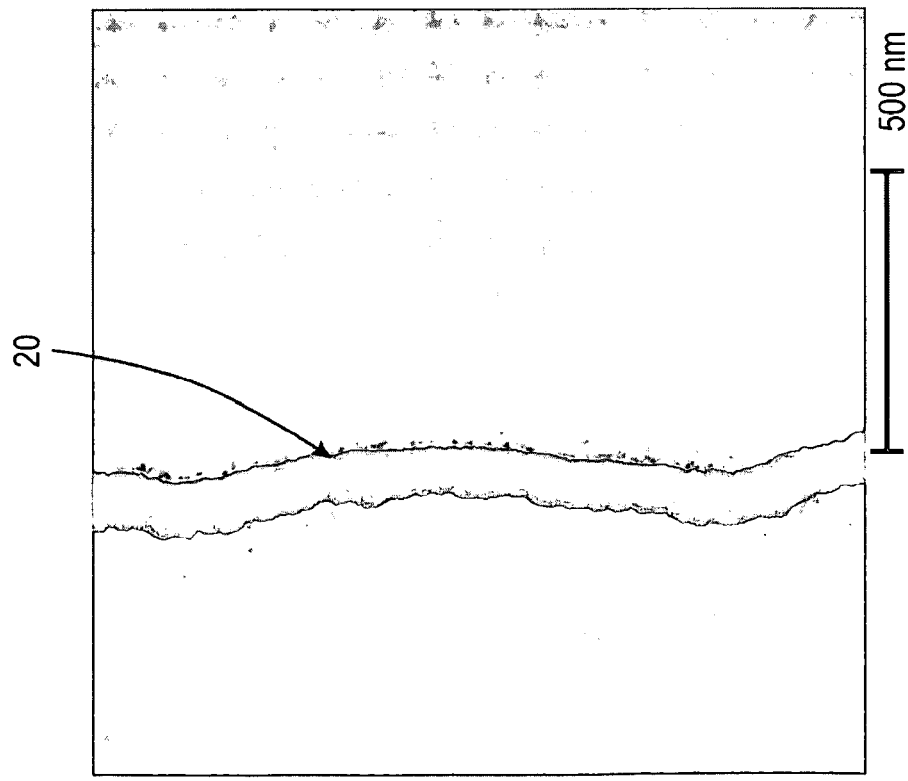

The growth of the nanowire 20 into the trench 18 occurs in three phases as shown in FIG. 3. First, a plating voltage for a metal nanowire material 20 such as, e.g., palladium, is applied to an aqueous solution containing 2 mM Pd(NO$_3$)$_2$, 2 mM saccharine, and 0.1 M KCl and immediately after the application of a plating voltage the current increases as the palladium nucleates along the entire length of the nickel nanoband electrode 14. When this nucleation process was complete, a quasi-constant deposition current was observed during growth of the confined metal nanowire 20 because the wetted surface area of the confined wire 20 is constant, and because for such a kinetically-controlled reaction, the deposition current per unit area of the metal is constant. The quasi-constant current seen from 20 to 50 seconds is seen because for this kinetically-controlled deposition process current is proportional to the wetted surface area which remains constant while growth of the nanowire 20 is confined to the horizontal trench 18. Terminating growth during this phase results in a nanowire 20 having a rectangular cross section, such as seen in FIG. 3b.

If wire growth is continued, deposited metal fills the trench 18 and begins to emerge from it and the total current increases because the wetted surface area increases. This "blooming" 21 of the nanowire 20 as it emerges from the trench is undesirable since it produces a distribution of dendrites along one edge of the nanowire as shown in FIG. 3c.

Figure 4B:
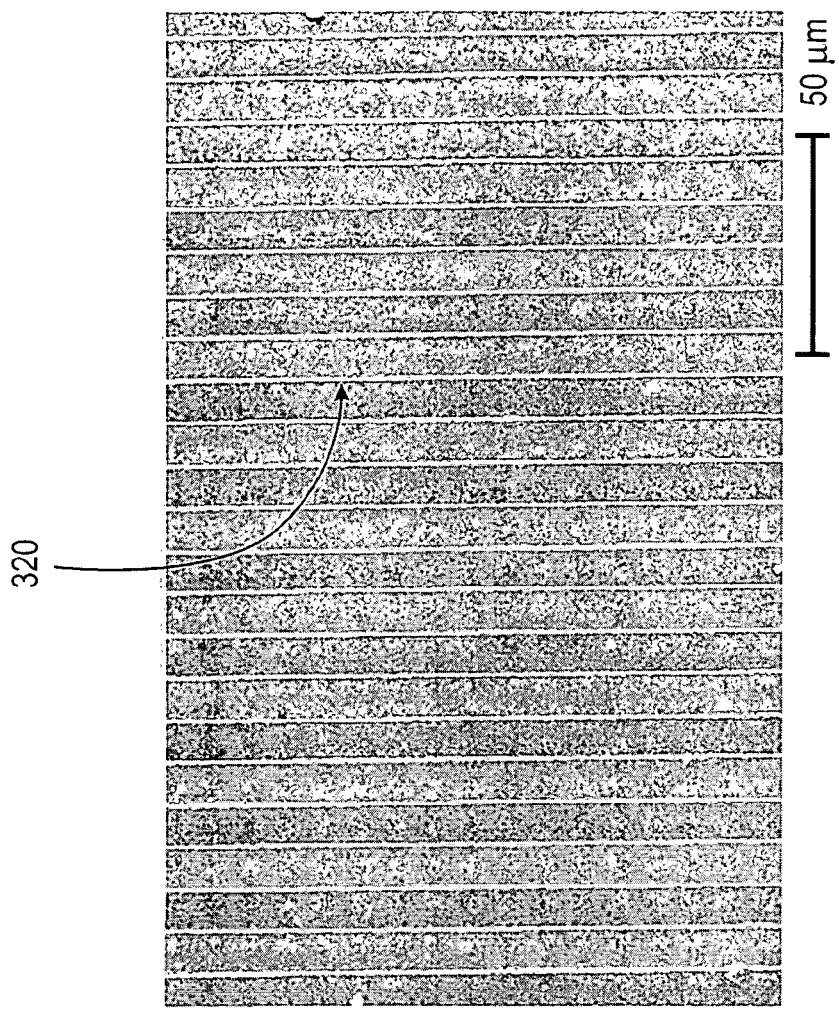
FIG. 4 are semi-images of examples of patterned nanowires prepared using LPNE process depicted in FIG. 1.
Figure 4A:
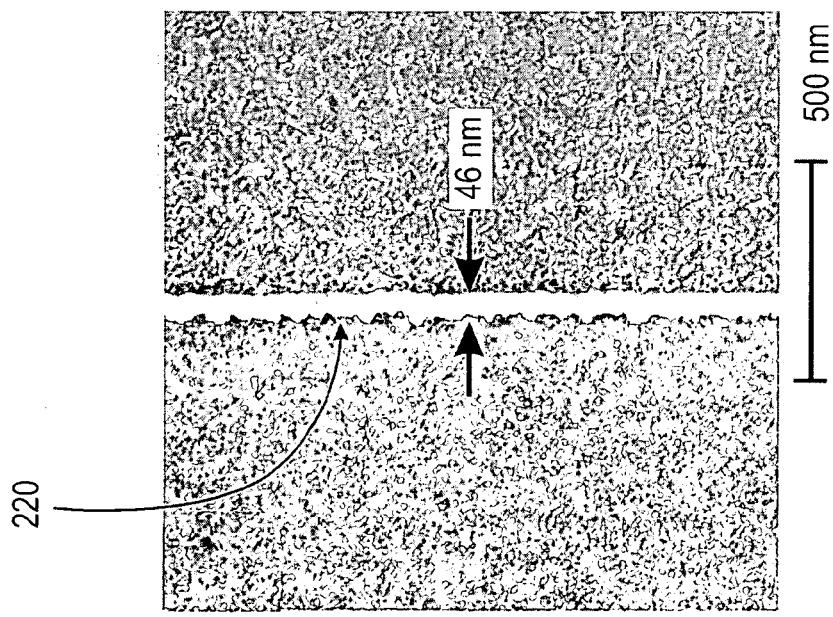
Figure 4D:
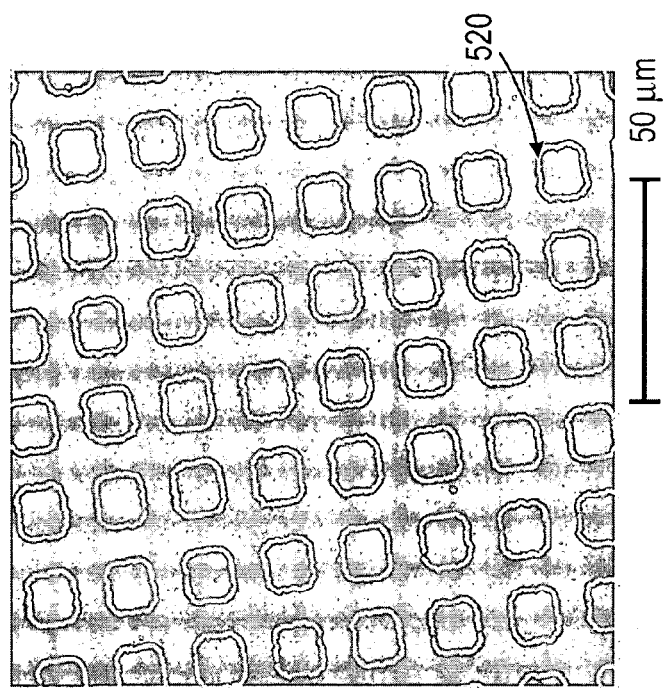
Figure 4C:
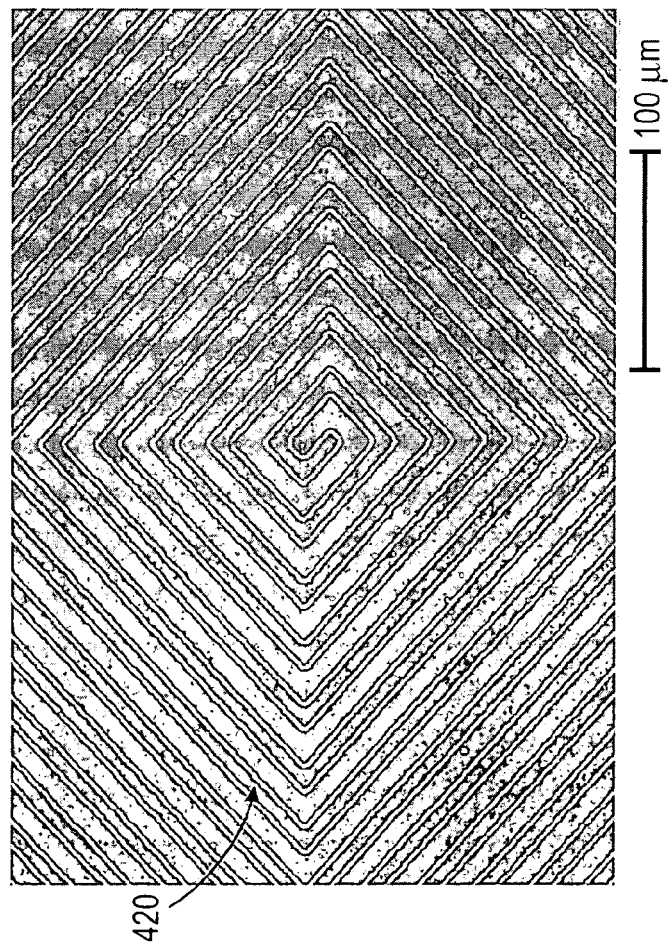
Figure 5A:
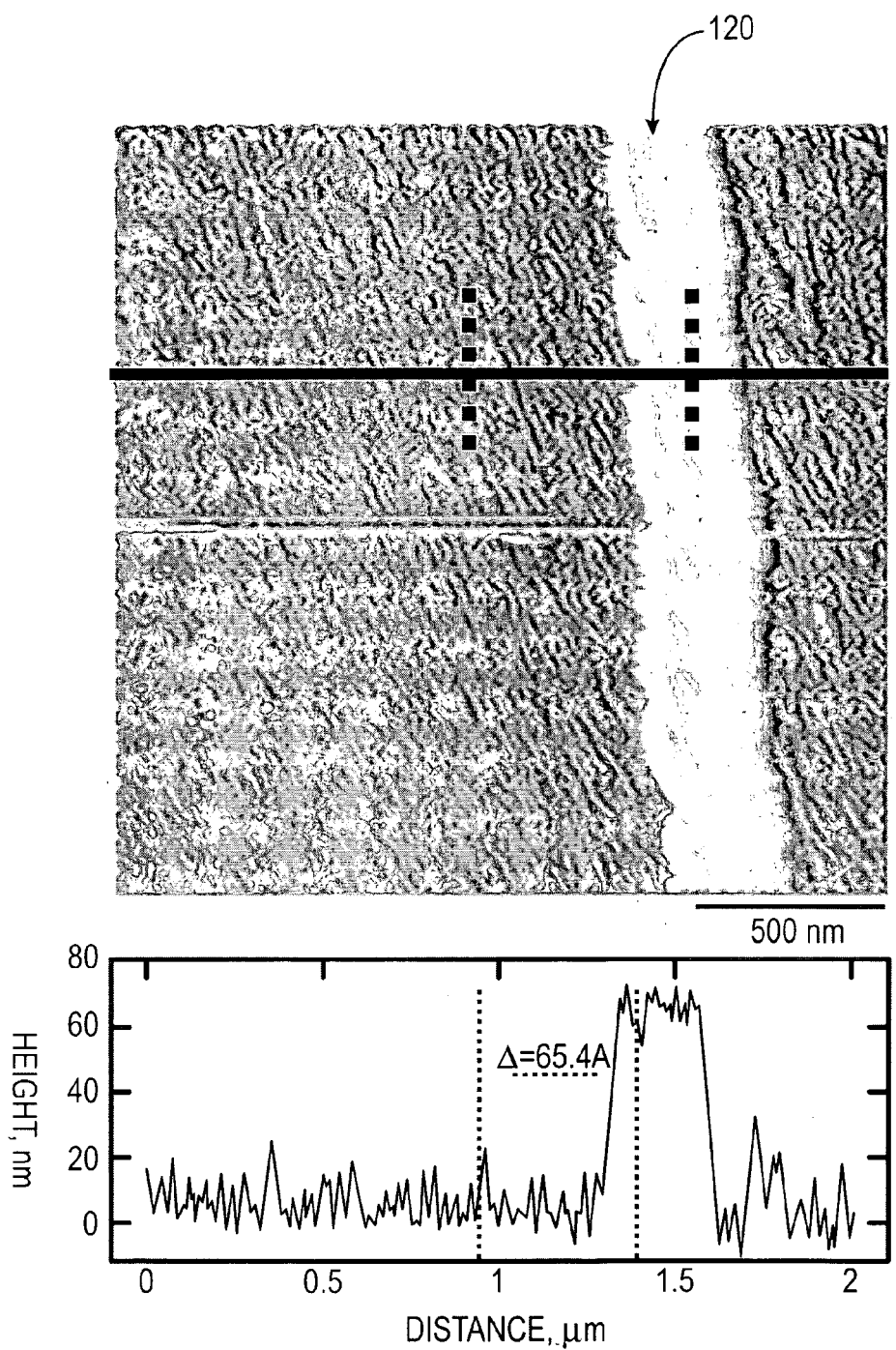
FIG. 5($a$) is an atomic force microscope (AFM) image showing the flat wire profile of a gold nanowire on glass prepared using the LPNE process.

The nanowires 120 produced by the LPNE process 10 shown in FIG. 1 have, as depicted in FIG. 5a, an approximately rectangular cross section that is enforced by the dimensions of the trench 18. The minimum dimensions for the width and height of these nanowires is about 40 nm and 20 nm, respectively. For example, a platinum nanowire 220 shown in the SEM image of FIG. 4a is 46 nm in width, 39 nm in height and 1 cm in length. As shown in FIGS. 4b-d, large substrate areas exceeding 1 cm$^2$ can be lithographically patterned with nanowires; i.e., (b) parallel gold nanowires 320, 1 cm in length and spaced by 9 μm; (c) a coiled nanowire 420 with total length of 2.7 cm; and (d) nanowire loops 520. The nanowires produced show remarkable dimensional uniformity over the entire sample surface. The relative standard deviations of the nanowire width and height were about 10-12% and <5%, respectively, for the patterns shown in FIGS. 4b-d. Of particular interest is the fact that corners, like those present in the pattern of the nanowire 420 shown in FIG. 4c, do not cause either narrowing or thickening of the nanowire—the latter expected for a diffusion-controlled deposition processes. This curvature invariance of the wire width is expected if the wire electrodeposition reaction occurs under conditions of kinetic, not diffusion, control.

Figure 5C:
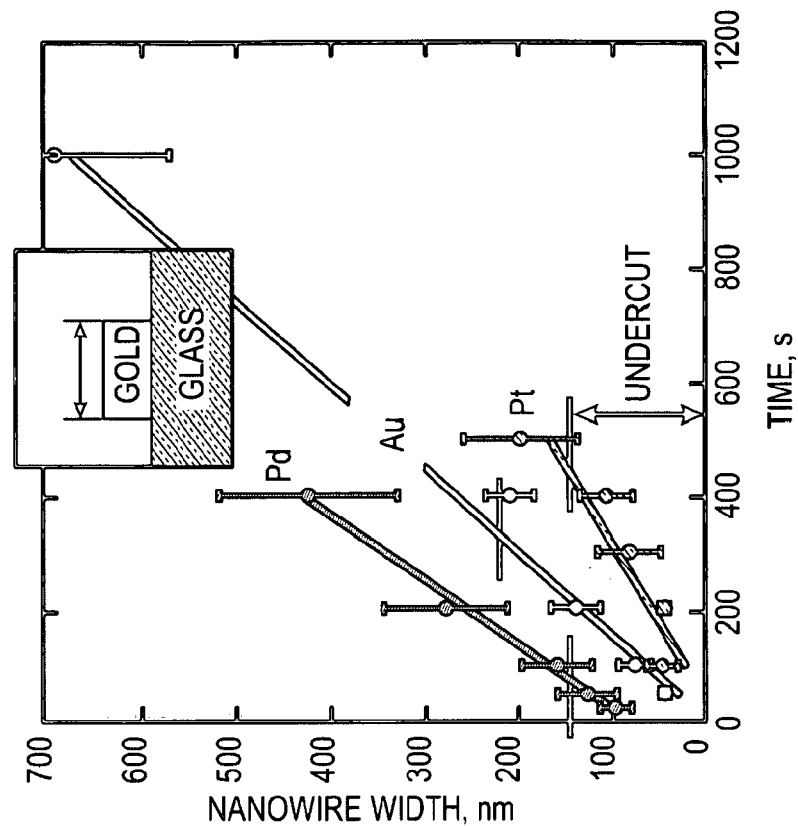
Figure 5B:
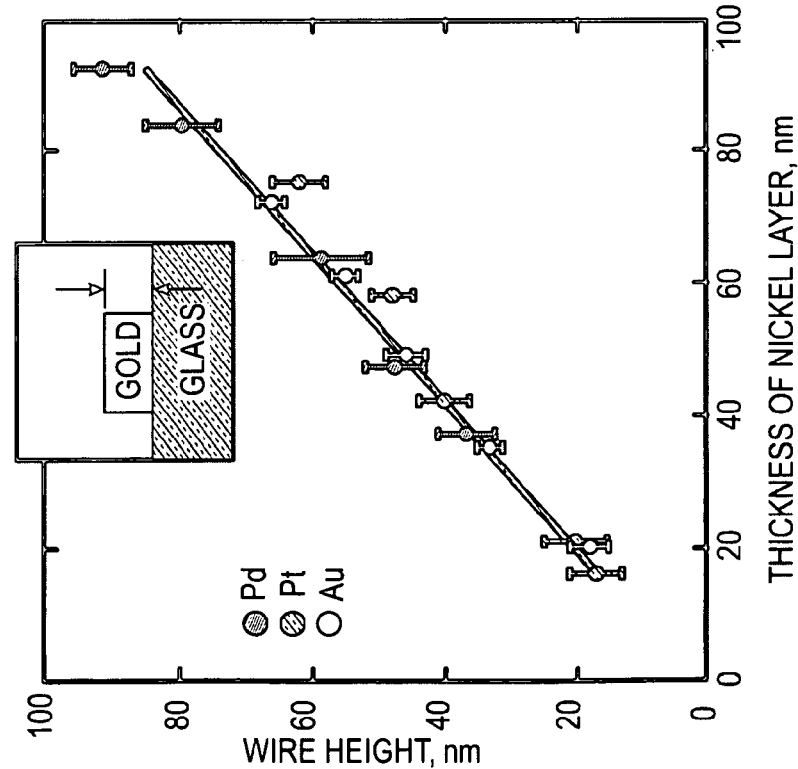

The width and height of these nanowires can be independently controlled as a function of electrode thickness or trench height and electrodeposition duration. The electrode layer thickness fixes the height of the nanowires while the width of the nanowires is proportional to the duration of the electrodeposition step. This control is documented by the data shown in FIGS. 5b and 5c. The AFM-measured nanowire height increases linearly with the nickel layer thickness for nanowires composed of gold, palladium and platinum (FIG. 5b). The slope of these data points is 0.98 indicating that the nanowire height equals the thickness of the evaporated nickel layer. The smallest attainable nanowire heights were in a range of about 18 nm for Au and Pt and somewhat larger for Pd. For a metal electrodeposition process occurring within a rectangular trench at a time-invariant current density, $J_{dep}$, the width of the deposited nanowire, w, is given by:

$$w(t) = J_{dep} t_{dep} V_m / nF \quad (1)$$

where $t_{dep}$ is the deposition time, $V_m$ is the molar volume of the deposited metal, n is the number of electrons required to reduce each metal complex ion, and F is the Faraday constant (96485 C eq.$^{-1}$). Plots of w versus $t_{dep}$ for gold, palladium and platinum (FIG. 5c) are all approximately linear in accordance with Eq. 1. The slopes of these plots are proportional to $J_{dep}$ the magnitude of which depends on the concentration of metal complex present in the plating solution and on the electrodeposition potential.

Figure 6A:
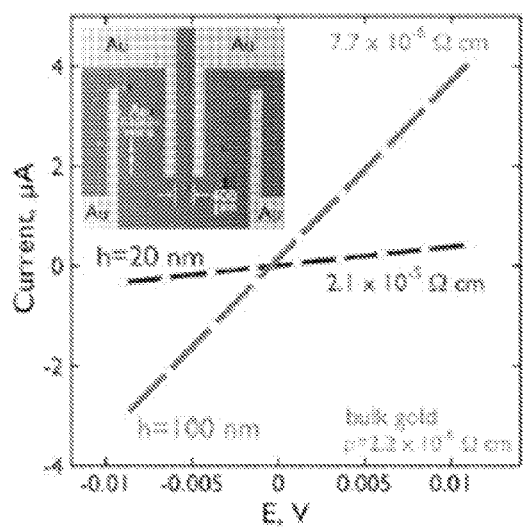
FIG. 6($a$) is a graph showing current versus voltage curves acquired using four evaporated electrodes (inset) for two gold nanowires prepared by the LPNE process. These nanowires had dimensions of 20 nm(h)×233 nm(w), and 100 nm(h)×166 nm(w)—the isolated wire length in both cases was 400 μm.
Figure 6B:
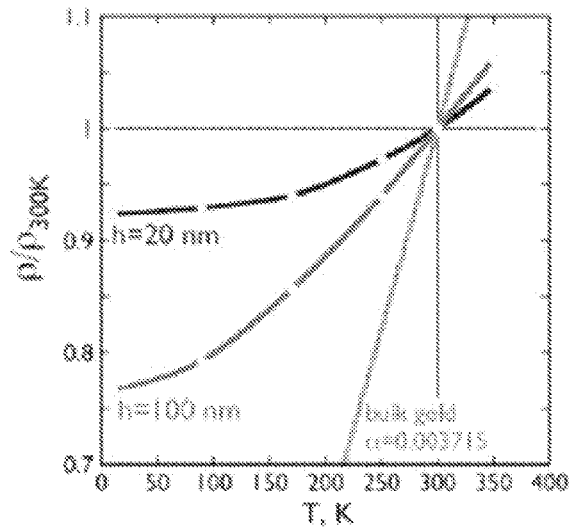

Previous measurements of the electrical properties of metal nanowires have employed wires ranging in length from 500 nm to 5 μm. Using a four-point probe shown in FIG. 6a (inset), we measured the electrical behavior of 4.00 μm long sections of two gold nanowires with cross-sections of 20 nm×233 nm, and 100 nm×166 nm. Two characteristics of metallic conduction are seen in these nanowires: First, the current voltage behavior was ohmic (FIG. 6a) and second, a positive temperature-coefficient of resistivity, α, was observed (FIG. 6b). However clear quantitative differences in the behavior of these nanowires, associated with their diminutive size, are also seen. The measured room temperature electrical resistivity of these nanowires was significantly higher than expected for bulk gold, and this disparity increased with decreasing temperature, down to 10K, just as reported for nanowires in several previous studies[14-18]. One well-understood source for the elevated electrical resistivity of the nanowires is boundary scattering: an increased frequency for the inelastic collision of conduction electrons with wire surfaces. But the contribution of boundary scattering to the total resistivity of our 20 nm nanowires, as estimated using Fuchs-Sondheimer theory, is approximately a factor of 2 in resistivity for the 20 nm nanowire and this enhancement is temperature independent. Two additional contributing factors are impurities in the electrodeposited gold, and a mismatch in the coefficients of thermal expansion for gold ($\kappa = 14 \times 10^{-6}$ K$^{-1}$, 300K) and the soda lime glass support ($\kappa = 9 \times 11^{-6}$ K$^{-1}$, 300K). This mismatch, which increases with decreasing temperature, means that the length of the gold nanowire shrinks more rapidly with decreasing temperature than the glass surface on which it is supported, placing it in tension. The total strain that accumulates in cooling from 300K to 80K, for example, is significant: approximately 0.7 μm for the 400 μm nanowires investigated here.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

REFERENCES

1. Spicer, D. F., Rodger, a. C. & Varnell, G. L. Computer-Controlled Pattern Generating System for Use with Electron-Beam Writing Instruments. Journal of Vacuum Science & Technology 10, 1052-1055 (1973).
2. Varnell, G. L., Spicer, D. F. & Rodger, a. C. E-Beam Writing Techniques for Semiconductor-Device Fabrication. Journal of Vacuum Science & Technology 10, 1048-1051 (1973).
3. Vieu, C. et al. Electron beam lithography: resolution limits and applications. Applied Surface Science 164, 111-117 (2000).
4. Berger, S. D. & Gibson, J. M. New Approach to Projection-Electron Lithography with Demonstrated 0.1 μM Linewidth. Applied Physics Letters 57, 153-155 (1990).
5. Berger, S. D. et al. Projection Electron-Beam Lithography—a New Approach. Journal of Vacuum Science & Technology B 9, 2996-2999 (1991).
6. Liddle, J. A. et al. Space-charge effects in projection electron-beam lithography: Results from the SCALPEL proofof-lithography system. Journal of Vacuum Science & Technology B 19, 476-481 (2001).
7. Jorritsma, J., Gijs, M. A. M., Kerkhof, J. M. & Stienen, J. G. H. General technique for fabricating large arrays of nanowires. Nanotechnology 7, 263-265 (1996).
8. Natelson, D., Willett, R. L., West, K. W. & Pfeiffer, L. N. Fabrication of extremely narrow metal wires. Applied Physics Letters 77, 1991-1993 (2000).
9. Natelson, D., Willett, R. L., West, K. W. & Pfeiffer, L. N. Geometry-dependent dephasing in small metallic wires. Physical Review Letters 86, 1821-1824 (2001).
10. Melosh, N. A. et al. Ultrahigh-density nanowire lattices and circuits. Science 300, 112-115 (2003).
11. Thompson, M. A., Menke, E. J., Martens, C. C. & Penner, R. M. Shrinking nanowires by kinetically controlled electrooxidation. J Phys Chem B 110, 36-41 (2006).
12. Nagale, M. P. & Fritsch, I. Individually addressable, submicrometer band electrode arrays. 1. Fabrication from multilayered materials. Analytical Chemistry 70, 2902-2907 (1998).
13. Bard, A. J. Electrochemical Methods: Fundamentals and Applications (Wiley & Sons, New York, 2001).
14. Durkan, C. & Welland, M. E. Size effects in the electrical resistivity of polycrystalline nanowires. Phys Rev B 61, 14215-14218 (2000).
15. Marzi, G. D., Iacopino, D., Quinn, A. J. & Redmond, G. Probing intrinsic transport properties of single metal nanowires: Direct-write contact formation using a focused ion beam. J Appl Phys 96, 3458-3462 (2004).
16. Yang, F. Y. et al. Large magnetoresistance of electrodeposited single-crystal bismuth thin films. Science 284, 1335-1337 (1999).
17. Yang, F. Y. et al. Large magnetoresistance and finite-size effect in electrodeposited bismuth lines. J Appl Phys 89, 7206-7208 (2001).
18. Chiu, P. & Shih, I. A study of the size effect on the temperature-dependent resistivity of bismuth nanowires with rectangular cross-sections. Nanotechnology 15, 1489-1492 (2004).
19. Fuchs, K. The conductivity of thin metallic films according to the electron theory of metals. P Camb Philos Soc 34, 100-108 (1938).
20. Sondheimer, E. H. The Mean Free Path of Electrons in Metals. Adv Phys 1, 1-42 (1952).

What is claimed:

1. A method for forming metal nanowires comprising the steps of
depositing a metal electrode layer on an insulator substrate,
depositing a layer of photoresist on the metal electrode layer,
photo lithographically patterning the photoresist exposing portions of the metal electrode layer,
stripping the exposed portion of metal layer from the substrate and forming a trench defined by the photoresist, the substrate and the metal electrode layer, and
electrodepositing a metal nanowire at the metal electrode layer within the trench.

2. The method of claim 1 wherein the metal nanowire has a height dimension corresponding to the thickness of the metal electrode layer.

3. The method of claim 2 wherein the metal nanowire has a width dimension that is a function of the duration of the electrodeposition process.

4. The method of claim 3 where in the width dimension is defined as $$w(t) = J_{dep} t_{dep} V_m / nF \quad (1)$$

where $t_{dep}$ is the deposition time, $V_m$ is the molar volume of the deposited metal, n is the number of electrons required to reduce each metal complex ion, and F is the Faraday constant (96485 C eq.$^{-1}$).

5. The method of claim 1 wherein the metal electrode layer is formed of one metal from of a group of metals consisting of nickel, copper, silver, and gold.

6. The method of claim 1 wherein the nanowire is formed of one metal from of a group of metals consisting of gold, palladium, platinum, cadmium, and bismuth.

7. The method of claim 1 wherein the nanowire is formed of metalloid.

8. The method of claim 1 wherein the step of photo lithographically patterning the photoresist includes
covering the photoresist with a mask having a predetermined pattern,
exposing the photoresist to ultra violet light, and
developing the photoresist exposed to ultra violet light and removing non-exposed photoresesist
removing the exposed electrode material such that it is recessed within the horizontal trench defined by the substrate and photoresist.

9. The method of claim 1 wherein the step of stripping the exposed portion of metal electrodlayer from the substrate and forming a trench includes electroxidation of the metal electrode layer.

10. The method of claim 1 wherein the step of stripping the exposed portion of metal electrodlayer from the substrate and forming a trench includes chemically etching the metal electrode layer.

11. A method of patterning metal nanowires on a substrate comprising the steps of:
photo lithographically forming a nanoband electrode on a substrate in a predetermined pattern,
electrodepositing a metal at the nanoband electrode to form a nanowire, and
removing the nanoband electrode from the substrate.

12. The method of claim 11 wherein the nanoband electrode is formed from nickel, copper, silver, or gold.

13. The method of claim 11 wherein the nanowire is formed of gold, palladium, platinum, cadmium, or bismuth.

14. The method of claim 11 wherein the nanowire is formed from a mettalloid.

15. The method of claim 11 wherein the step of forming the nanoband electrode includes
depositing a film of metal for a sacrificial nanoband electrode on the substrate,
patterning photoresist over the film,
developing the photoresist,
removing the exposed electrode material such that it is recessed between the photoresist and substrate forming trench defined by the substrate, electrode and photoresist.

16. The method of claim 11 wherein the metal nanowire has a height dimension corresponding to the thickness of the nanoband electrode layer.

17. The method of claim 16 wherein the metal nanowire has a width dimension that is a function of the duration of the electrodeposition process.

18. The method of claim 17 where in the width dimension is defined as $$w(t) = J_{dep} t_{dep} V_m / nF \qquad (1)$$

where $t_{dep}$ is the deposition time, $V_m$ is the molar volume of the deposited metal, n is the number of electrons required to reduce each metal complex ion, and F is the Faraday constant (96485 C eq.$^{-1}$).

19. The method of claim 11 wherein the nanowire has a square cross-section.

20. The method of claim 19 wherein the nanowire has height and width dimension of about 6 nm in height and about 20 nm in width.

* * * * *